United States Patent
Scheidler et al.

(10) Patent No.: US 8,508,940 B2
(45) Date of Patent: Aug. 13, 2013

(54) RACK HOUSING FOR ACCOMMODATING A PLURALITY OF FANLESS, PLUG-IN COMPONENTS

(75) Inventors: Gerold Scheidler, Bad Wünnenberg (DE); Van Son Nguyen, Warendorf (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 278 days.

(21) Appl. No.: 13/107,170

(22) Filed: May 13, 2011

(65) Prior Publication Data

US 2011/0285261 A1    Nov. 24, 2011

(30) Foreign Application Priority Data

May 20, 2010   (DE) ..................... 20 2010 007 046 U

(51) Int. Cl.
    *H05K 7/20*    (2006.01)
(52) U.S. Cl.
    USPC ........................ 361/695; 361/679.48; 454/184
(58) Field of Classification Search
    None
    See application file for complete search history.

(56) References Cited

U.S. PATENT DOCUMENTS

| | | | |
|---|---|---|---|
| 5,107,398 A | | 4/1992 | Bailey |
| 6,822,859 B2* | | 11/2004 | Coglitore et al. ........ 361/679.49 |
| 6,951,513 B1* | | 10/2005 | Greenslade et al. .......... 454/184 |
| 7,112,131 B2* | | 9/2006 | Rasmussen et al. .......... 454/184 |
| 7,154,748 B2* | | 12/2006 | Yamada ........................ 361/690 |
| 7,724,515 B2* | | 5/2010 | Fukuda et al. ............. 361/679.5 |
| 7,826,222 B2* | | 11/2010 | Aybay et al. .................. 361/695 |
| 7,867,070 B2* | | 1/2011 | Day .............................. 454/184 |
| 8,233,274 B2* | | 7/2012 | Archibald et al. ....... 361/679.46 |
| 2009/0184613 A1 | | 7/2009 | Barina et al. |

FOREIGN PATENT DOCUMENTS

| CA | 2 729 390 A1 | 1/2010 |
|---|---|---|
| DE | 197 42 373 A1 | 4/1999 |
| DE | 10 2005 009 074 A1 | 9/2006 |
| DE | 10 2008 062 430 A1 | 7/2010 |
| DE | 10 2009 011 007 A1 | 9/2010 |
| WO | 2010/000440 A1 | 1/2010 |

* cited by examiner

*Primary Examiner* — Boris Chervinsky
(74) *Attorney, Agent, or Firm* — DLA Piper LLP (US)

(57) ABSTRACT

A rack housing that accommodates a plurality of fanless, plug-in components includes a plurality of plug-in positions that accommodate the plurality of fanless, plug-in components in a first region of the rack housing bordering a first housing side, at least one installation chamber that accommodates at least one add-on component with at least one fan, and at least one low-pressure chamber in a second region of the rack housing bordering the first region, wherein 1) first openings are provided between the low-pressure chamber and the plug-in positions, which openings allow a discharge of air heated by the plug-in components into the low-pressure chamber, 2) the at least one installation chamber and the at least one low-pressure chamber are essentially decoupled from each other with respect to cooling air, and 3) the installation chamber is connected to the low-pressure chamber via at least one connector for forced ventilation.

17 Claims, 4 Drawing Sheets

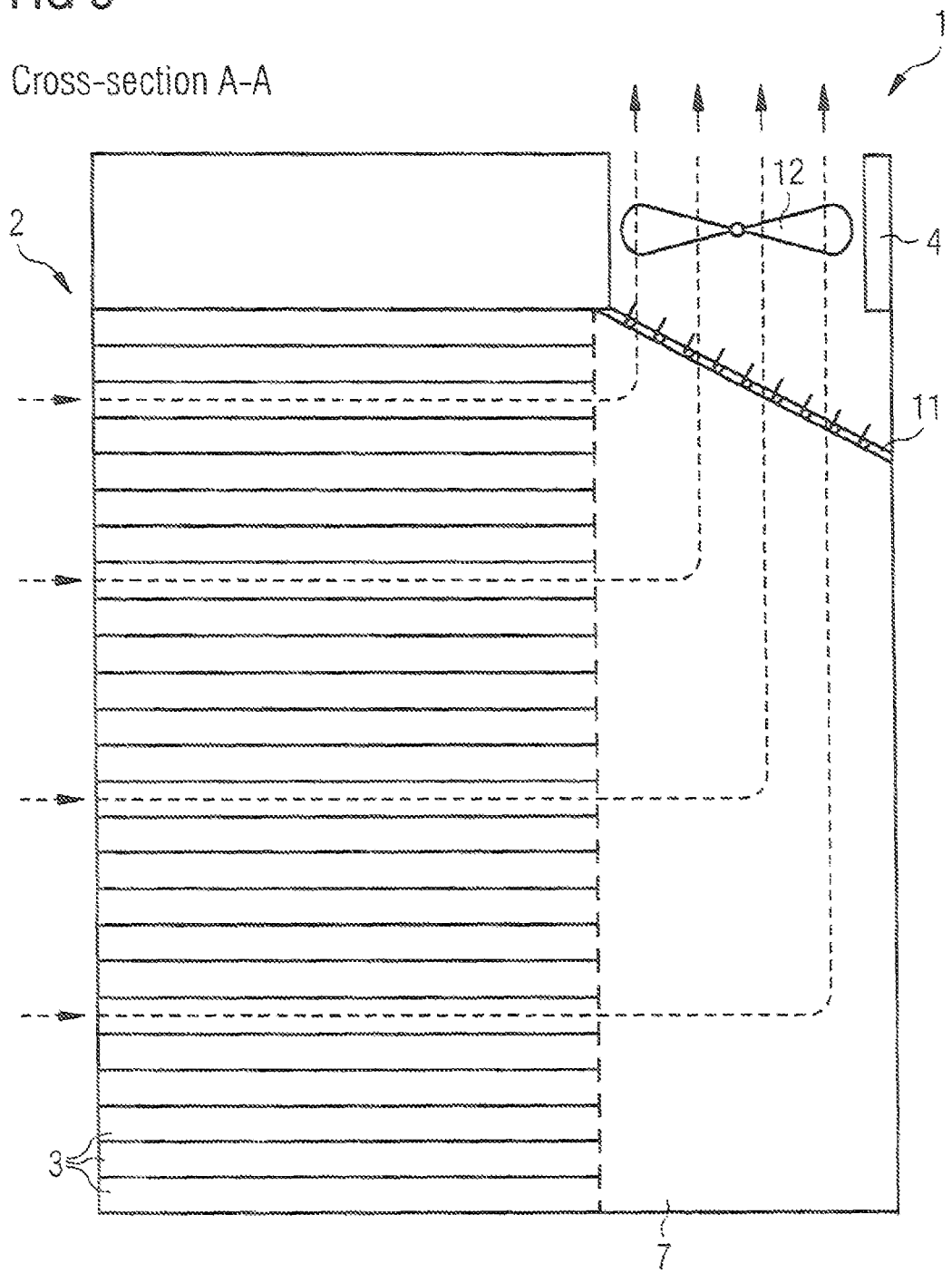

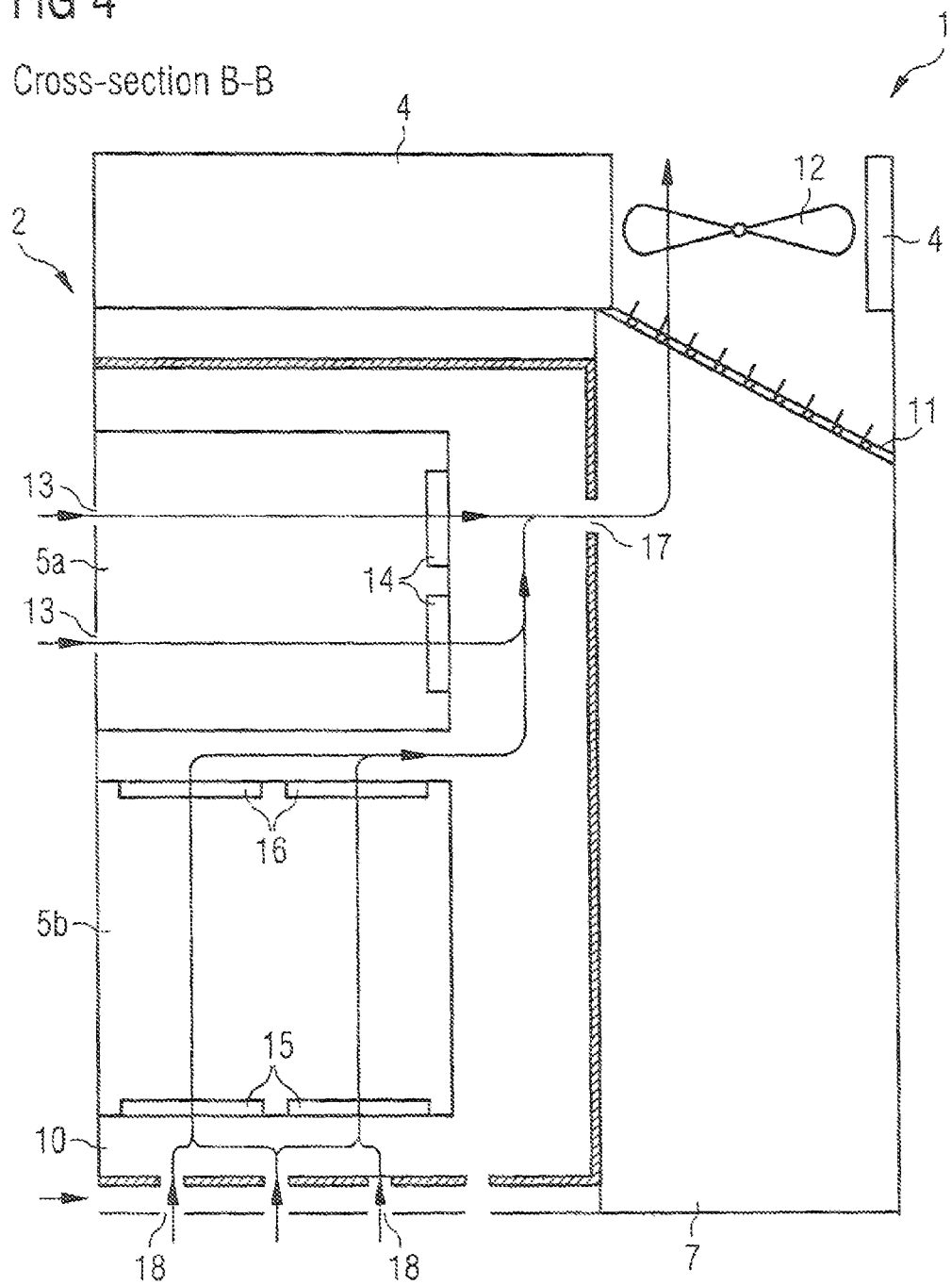

RACK HOUSING FOR ACCOMMODATING A PLURALITY OF FANLESS, PLUG-IN COMPONENTS

RELATED APPLICATION

This application claims priority of German Patent Application No. 202010007046.5, filed May 20, 2010, herein incorporated by reference.

TECHNICAL FIELD

This disclosure relates to a rack housing that accommodates a plurality of fanless, plug-in components.

BACKGROUND

In addition to server computers, often communications components, in particular, so-called "network switches," are also arranged in such rack housings, wherein these communications components establish a data connection between the individual server computers, as well as between the server computers and an external data network. While the server computers are often specially adapted to the rack housing used, for their connection, as a rule, network switches generally available on the market are used.

One problem in the use of generally available network switches is their cooling architecture is not adapted, as a rule, to the special conditions of a rack housing. In particular, there is the problem that cooling such additional components exerts a disadvantageous effect on the central cooling of the rack housing.

It could therefore be helpful to provide a rack housing suitable for the integration of various kinds of components. In particular, it should allow the accommodation of commercially available add-on components in a rack housing with central low-pressure cooling.

SUMMARY

We provide a rack housing that accommodates a plurality of fanless, plug-in components including a plurality of plug-in positions that accommodate the plurality of fanless, plug-in components in a first region of the rack housing bordering a first housing side, at least one installation chamber that accommodates at least one add-on component with at least one fan, and at least one low-pressure chamber in a second region of the rack housing bordering the first region, wherein 1) first openings are provided between the low-pressure chamber and the plug-in positions, which openings allow a discharge of air heated by the plug-in components into the low-pressure chamber, 2) the at least one installation chamber and the at least one low-pressure chamber are essentially decoupled from each other with respect to cooling air, and 3) the installation chamber is connected to the low-pressure chamber via at least one connector for forced ventilation.

BRIEF DESCRIPTION OF THE DRAWINGS

FIG. 3 shows a section through the rack housing along the axis A-A in the vertical plane.

FIG. 4 shows a section through the rack housing along the axis B-B in the vertical plane.

DETAILED DESCRIPTION

Figure 1:
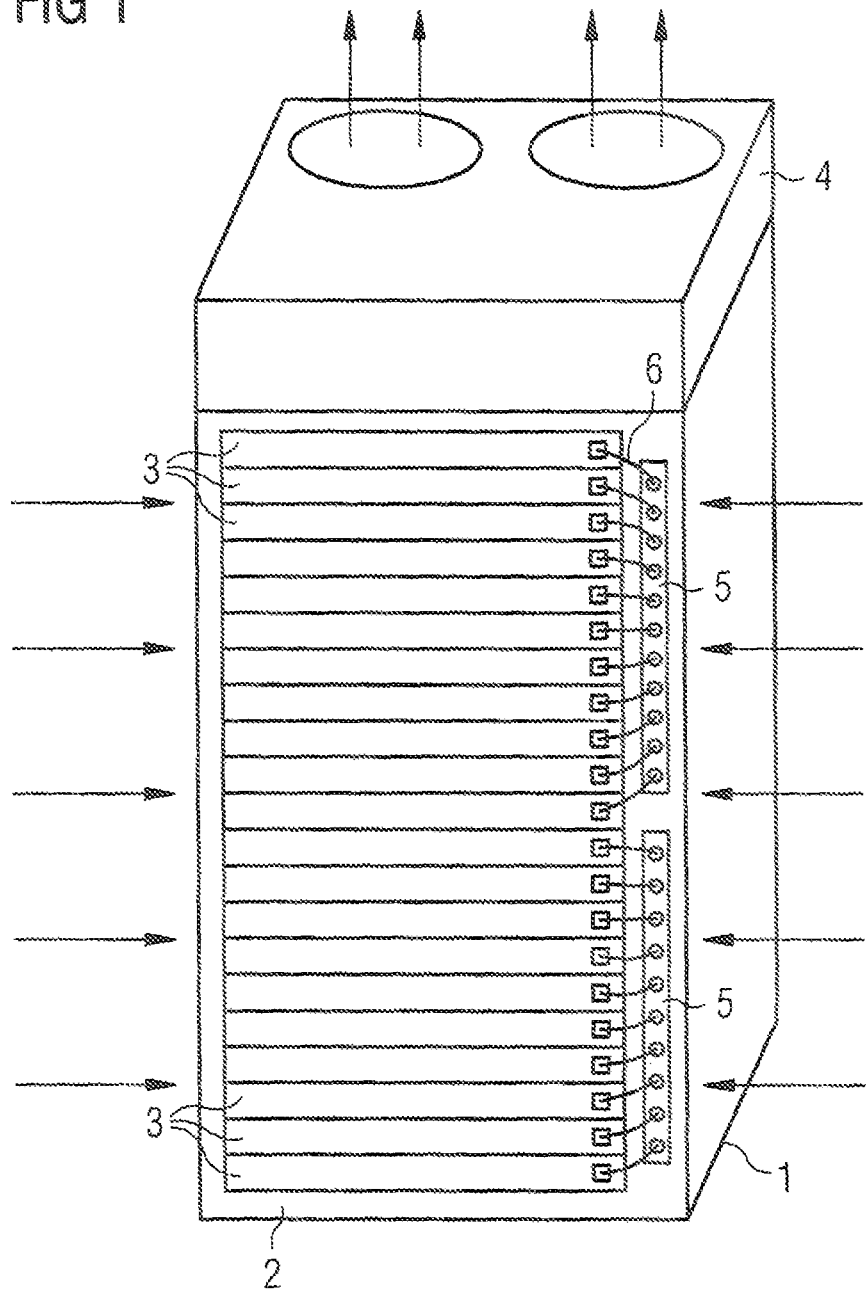
FIG. 1 shows a perspective view of a rack housing.

We provide a rack housing having a plurality of plug-in positions that accommodate a plurality of fanless, plug-in components in a first region of the rack housing bordering a first housing side. In addition, the rack housing has at least one low-pressure shaft in a second region of the rack housing bordering the first region, wherein first openings are provided between the low-pressure shaft and the plug-in positions, with these openings allowing a discharge of air heated by the plug-in components into the low-pressure shaft.

Such a rack housing provides for central cooling of a plurality of fanless, plug-in components. It is suitable, in particular, for the design of especially efficient and economical data centers in which a plurality of server computers with simple, preferably identical, designs are accommodated in a shared rack housing and are centrally cooled in the rack housing.

The rack housing may have at least one installation chamber for accommodating at least one add-on component with at least one fan, wherein the at least one installation chamber and the at least one low-pressure chamber are decoupled from each other with respect to cooling air. The installation chamber may be connected to the low-pressure chamber by at least one connection means for forced ventilation.

Through the described measures, regions essentially decoupled from each other with respect to cooling air are created to cool the fanless, plug-in components and feed air to and vent air from additional add-on components with at least one fan. Through the low-pressure chamber, a discharge of cooling air heated by the plug-in components and the add-on components is created. Through the essential decoupling of the installation chamber from the low-pressure chamber, the influence of a pressure drop occurring therein due to the fans of the add-on components is essentially avoided. Through the connection means for forced ventilation, a buildup of heat in the installation chamber is simultaneously avoided.

The installation chambers and the low-pressure chamber may be arranged adjacently, wherein a separating wall between the installation chamber and the low-pressure chamber has at least one second opening as a connection means for forced ventilation. Such an arrangement allows an especially simple forced ventilation. Alternatively, however, hoses, tubes, or other connections could also be provided between the installation chamber and the low-pressure chamber.

A divider panel may be arranged between the first region and the second region, wherein the first openings are arranged in the divider panel. Preferably, a first ratio between the cross-sectional surface area of the second opening and the surface area of the separating wall is less than a second ratio between the cross-sectional surface area of the first openings and the surface area of the divider panel. By adapting the first ratio and/or the second ratio, a desired pressure drop can be set between the low-pressure chamber and the fanless, plug-in components on one side and the low-pressure chamber and the installation chamber on the other side.

The installation chamber may have at least one third opening for the inlet of ambient air from an outer side of the rack housing. Such a third opening allows the feeding of relatively cold ambient air into the installation chamber.

Preferably, the third opening is arranged underneath the at least one connection means. Through the arrangement of the third opening in the lower region of an installation chamber and the corresponding arrangement of the connection means in the upper region of the installation chamber, stacking effects can be used to improve cooling the add-on components accommodated therein. Even without the effect of the fan of the add-on component, the heated cooling air rising upward is drawn through the connection means and replaced by ambient air coming in through the third opening.

The installation chamber may be designed for the spaced-apart installation of add-on components so that the at least one add-on component can receive or dissipate air on at least two, preferably three or more, sides. Such an installation position allows the use of a plurality of different add-on components with different ventilation concepts. For example, add-on components can be used with ventilation from front to back, from left to right or vice versa, or from one side to the back or front.

Additional advantageous constructions are described in detail below as well as the following detailed description of selected representative examples.

FIG. 1 shows a rack housing 1. For example, it involves a rack housing for accommodating plug-in components in the so-called "19"-format." The rack housing 1 has, on its front side 2, a plurality of plug-in positions, in each of which, in the illustrated example, a fanless, plug-in component 3 is accommodated. The fanless, plug-in components 3 involve server computers.

The fanless, plug-in components 3 have, on their front side and also on a back side not visible in FIG. 1, housing openings that are used to cool the plug-in components 3. To this end, with an exhaust-air unit 4 arranged on the rack housing 1, a low pressure is generated in a low-pressure chamber of the rack housing 1. To equalize the low pressure, ambient air flows into the rack housing 1 from the front through the fanless, plug-in components 3 and thus leads to the cooling of the fanless, plug-in components 3. The cooling-air flow is simplified in FIG. 1 by arrows.

To connect the individual plug-in components 3 to each other with respect to data, in the illustrated example, two add-on components 5 are accommodated in the rack housing 1. The add-on components 5 are installed on one side of the rack housing 1 rotated, with respect to the fanless, plug-in components 3, by 90°. The add-on components 5 involve network switches or routers. The add-on components 5 and fanless, plug-in components 3 allocated to these add-on components are connected to each other by so-called "patch cables" 6. In addition, the add-on components 5 can also be connected to each other or coupled with a local or global network of a data center. It is likewise possible to couple each of the fanless, plug-in components 3 with several add-on components 5 to achieve a redundancy in the case of the loss of one of the add-on components 5 or one of the network connections. These additional connections, however, are not shown in FIG. 1 for reasons of clarity.

Figure 2:
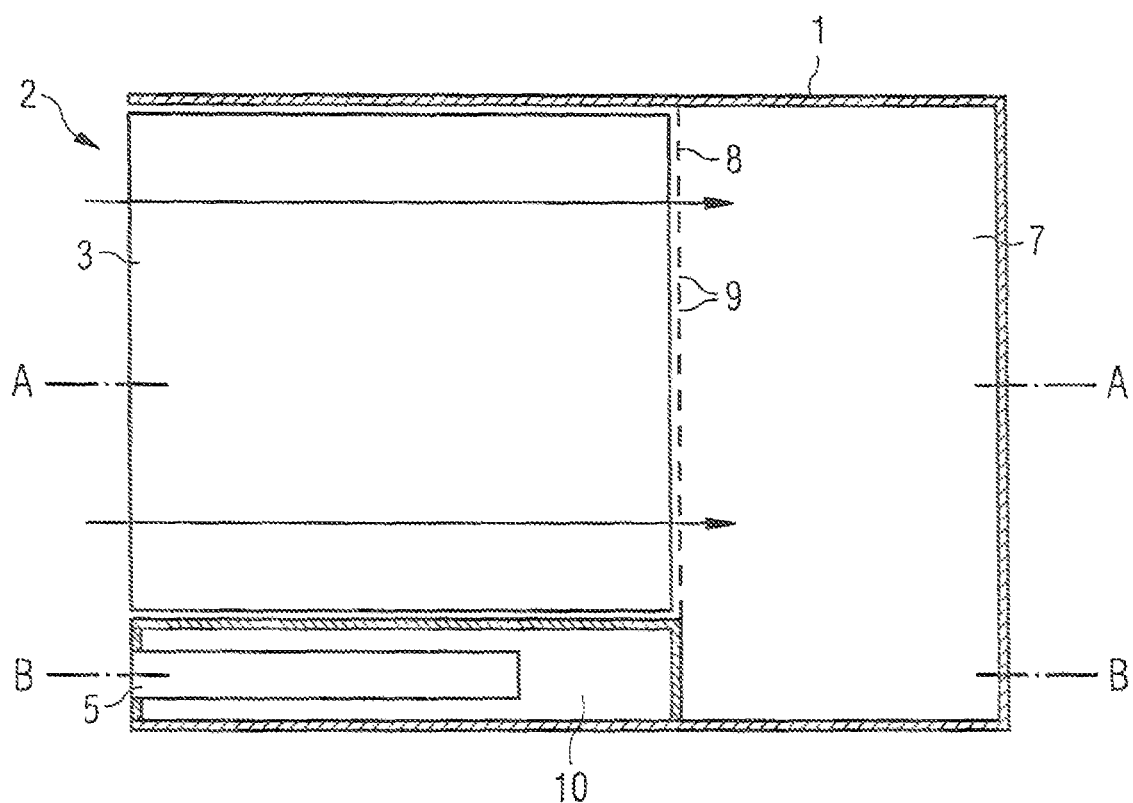
FIG. 2 shows a cross section through a rack housing in a horizontal plane.

FIG. 2 shows a cross section through the rack housing 1 according to FIG. 1 in a horizontal plane. A low-pressure chamber 7 is located in a rear region of the rack housing 1. The low-pressure chamber 7 has a shaft-like construction and runs across the entire height of the rack housing 1.

A divider panel 8 is arranged between the rear housing region with the low-pressure chamber 7 and the front housing region with the fanless, plug-in components 3, with first openings 9 being machined in this divider panel for the passage of cooling air. The size of the first openings 9 is selected so that the airflow through the fanless, plug-in components 3 is sufficient to cool the electrical or electronic components arranged therein. Simultaneously, the first openings 9 are selected so small that the exhaust-air unit 4 can maintain a low pressure sufficient for cooling across the entire height of the low-pressure chamber 7 or of the rack housing 1.

From FIG. 2 it is also given that, in a side region of the rack housing 1, an additional installation chamber 10 is provided that is essentially decoupled with respect to cooling air from the first housing region with the fanless, plug-in components 3 and the second housing region with the low-pressure chamber 7. In particular, the installation chamber 10 is separated from the other regions of the rack housing 1 by a housing wall toward all of the sides.

In the installation chamber 10, an add-on component 5 is accommodated. Preferably, the add-on component 5 is mounted on the front side 2 of the installation chamber 10, for example, by a front-plate screw connection. This is not illustrated, however, in FIG. 2. From FIG. 2 it is given, however, that the add-on component 5 is spaced-apart in the installation chamber 10 so that cooling air can be guided from several sides onto the add-on component 5 or can be dissipated from it. From FIG. 2 it is given, in particular, that a small distance of, for example, about 0.5 to about 2.5 cm is present to the left and right of the add-on component 5 and a distance of, for example, about 5 to about 10 cm is present behind the add-on component 5.

FIG. 3 shows a section in the vertical plane along the axis A-A according to FIG. 2. The section shown in FIG. 3 shows, in particular, the flow of cooling air through the first region of the rack housing 1 with the fanless, plug-in components 3. Fresh air is guided from the front side 2 through the fanless, plug-in components 3 and is drawn into the low-pressure chamber 7.

In the low-pressure chamber 7, a blowback grating 11 is arranged that closes the low-pressure chamber 7 in the case of the loss of a first fan 12 of the exhaust-air unit 4 to maintain the low pressure generated by the second fans 12. By the fans 12, the heated cooling air is discharged upwardly from the fanless, plug-in components 3 and received there, for example, by an exhaust-air hood or discharged to an exhaust-air system of a building installation.

In FIG. 4, the section through the rack housing 1 in the vertical plane along the axis B-B according to FIG. 2 is illustrated. The cooling-air flow can be drawn into or through the installation chamber 10.

Two add-on components 5 are accommodated in the installation chamber 10, wherein the upper add-on component 5a has a different cooling-air guide than the lower add-on component 5b. In particular, the upper add-on component 5a has housing openings 13 on its front side. In addition, the add-on component 5a has fan units 14 on its back side such that air is drawn out from the housing interior of the add-on component 5a and discharged to the outside.

Deviating from this, the lower add-on component 5b has side fan units 15 or 16 with which air is suctioned from one housing side and discharged to the other housing side. Thus, a cooling air guide rotated by 90° with respect to the first add-on component 5a is produced into the add-on component 5b. Other known ventilation arrangements that are, however, not illustrated in FIG. 4 comprise, for example, side ventilation gratings and a fan unit on the back side of the housing to draw heated air out from the housing of the add-on component or an arrangement made from a fan unit and ventilation grating in which air drawn from the back is discharged from the housing of the add-on component toward the front through a front panel.

In the cross section according to FIG. 4, a distance of, for example, about 2.5 to about 10 cm is also maintained above and underneath the add-on components 5a and 5b to allow an undisturbed reception or discharge of cooling air through the fan units or corresponding ventilation gratings of the add-on components 5a and 5b.

Because the installation chamber 10 is essentially decoupled from the low-pressure chamber 7, the different cooling-air guides of the add-on components 5 generate no disruption of the pressure drop in the low-pressure chamber 7. In particular, the pressure drop from top to bottom in the low-pressure chamber 7 is not influenced by the fan units 14, 15 and 16.

To avoid a buildup of heat in the installation chamber 10, this has, in the upper housing third, a second opening 17 with which the installation chamber 10 is connected to the low-pressure chamber 7. The size of the second opening 17 is selected so that it does not significantly influence the pressure drop within the low-pressure chamber 7, but simultaneously guarantees a secure discharge of hot air present in the installation chamber 10.

To replace the hot air discharged in the upper region of the installation chamber 10 by cooler ambient air, third openings 18 are provided in the base of the installation chamber 10 and also in the bordering region of the rack housing 1, wherein these third openings allow a feeding of cold air in a lower region of the installation chamber 10. The third openings 18 can be supplied with fresh air, for example, from the front side 2 of the rack housing 1 or from a base grating arranged underneath the rack housing 1.

In FIGS. 1-4, a rack housing 1 with an installation chamber 10 to accommodate two add-on components 5 one above the other is illustrated. It is also possible to provide in the rack housing 1 additional low-pressure chambers 7, for example, one next to or above the other for additional add-on components 5. In addition, it is possible to arrange additional add-on components 5 in one and the same low-pressure chamber 7.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. A rack housing that accommodates a plurality of fanless, plug-in components comprising:
   a plurality of plug-in positions that accommodate the plurality of fanless, plug-in components in a first region of the rack housing bordering a first housing side;
   at least one installation chamber that accommodates at least one add-on component with at least one fan; and
   at least one low-pressure chamber in a second region of the rack housing bordering the first region,
   wherein
   1) first openings are provided between the low-pressure chamber and the plug-in positions, which openings allow a discharge of air heated by the plug-in components into the low-pressure chamber,
   2) the at least one installation chamber and the at least one low-pressure chamber are essentially decoupled from each other with respect to cooling air, and
   3) the installation chamber is connected to the low-pressure chamber via at least one connector for forced ventilation.

2. The rack housing according to claim 1, wherein the installation chamber and the low-pressure chamber are arranged adjacent to one another, and a separating wall between the installation chamber and the low-pressure chamber has at least one second opening as a connector for forced ventilation.

3. The rack housing according to claim 2, wherein a first ratio between a cross-sectional surface area of a second opening and a surface area of the separating wall is less than 1:10, 1:20, 1:50, 1:100, or 1:500.

4. The rack housing according to claim 1, further comprising a divider panel arranged between the first and second regions, wherein the first openings are arranged in the divider panel.

5. The rack housing according to claim 4, wherein a first ratio between a cross-sectional surface area of a second opening and a surface area of a separating wall is less than a ratio between a cross-sectional surface area of the first openings and a surface area of the divider panel.

6. The rack housing according to claim 1, wherein the installation chamber has at least one third opening for inlet of ambient air from an outer side of the rack housing.

7. The rack housing according to claim 6, wherein the third opening is arranged underneath the at least one connector such that the third opening is arranged in a lower third of the installation chamber and the connector is arranged in an upper third of the installation chamber.

8. The rack housing according to claim 1, wherein the installation chamber is shaped and sized for spaced-apart installation of an add-on component so that the at least one add-on component can receive or dissipate air on at least two sides.

9. The rack housing according to claim 1, having a plurality of installation chambers that accommodate add-on components and/or wherein the at least one installation chamber is sized and shaped to accommodate a plurality of add-on components.

10. The rack housing according to claim 8, wherein the fanless, plug-in components are data-processing devices, the add-on component is a communications device, and the data-processing devices and the communications device are coupled with each other with respect to data with connector arranged on a first side of the housing.

11. The rack housing according to claim 1, further comprising an exhaust-air unit with at least one fan unit allocated to at least one fourth opening that draws heated cooling air out from the low-pressure chamber.

12. The rack housing according to claim 2, further comprising a divider panel arranged between the first and the second regions, wherein the first openings are arranged in the divider panel.

13. The rack housing according to claim 3, further comprising a divider panel arranged between the first and second regions, wherein the first openings are arranged in the divider panel.

14. The rack housing according to claim 2, wherein the installation chamber has at least one third opening for inlet of ambient air from an outer side of the rack housing.

15. The rack housing according to claim 3, wherein the installation chamber has at least one third opening for inlet of ambient air from an outer side of the rack housing.

16. The rack housing according to claim 4, wherein the installation chamber has at least one third opening for inlet of ambient air from an outer side of the rack housing.

17. The rack housing according to claim 5, wherein the installation chamber has at least one third opening for inlet of ambient air from an outer side of the rack housing.

* * * * *